(12) United States Patent
Protheroe et al.

(10) Patent No.: US 9,337,354 B2
(45) Date of Patent: *May 10, 2016

(54) TOP PORT MEMS CAVITY PACKAGE AND METHOD OF MANUFACTURE THEREOF

(71) Applicant: Unisem (M) Berhad, Kuala Lumpur (MY)

(72) Inventors: Rob Protheroe, Caerphilly (GB); Alan Evans, Portishead (GB); Timothy Leung, Singapore (SG); Tang Ming Xiang, Chengdu (CN); Guan JunHua, Chengdu (CN)

(73) Assignee: Unisem (M) Berhad, Kuala Lumpur (MY)

( * ) Notice: Subject to any disclaimer, the term of this patent is extended or adjusted under 35 U.S.C. 154(b) by 0 days.

This patent is subject to a terminal disclaimer.

(21) Appl. No.: 14/797,436

(22) Filed: Jul. 13, 2015

(65) Prior Publication Data

US 2015/0315014 A1    Nov. 5, 2015

Related U.S. Application Data

(63) Continuation of application No. 14/142,744, filed on Dec. 27, 2013, now Pat. No. 9,082,883, which is a continuation-in-part of application No. 13/783,557, filed on Mar. 4, 2013, now Pat. No. 8,999,757.

(51) Int. Cl.
*H01L 29/84* (2006.01)
*B81C 1/00* (2006.01)
(Continued)

(52) U.S. Cl.
CPC .............. *H01L 29/84* (2013.01); *B81B 7/0058* (2013.01); *B81C 1/00269* (2013.01);
(Continued)

(58) Field of Classification Search
CPC ... H01L 23/053; H01L 29/84; B81C 1/00309; B81C 1/00333
See application file for complete search history.

(56) References Cited

U.S. PATENT DOCUMENTS 5,870,482 A   2/1999   Loeppert et al.
7,166,910 B2  1/2007   Minervini
(Continued)

FOREIGN PATENT DOCUMENTS

CN    102742301    10/2012
CN    102815657    12/2012
WO    2011076910    6/2011

OTHER PUBLICATIONS

First Office Action from Chinese Patent Application No. 201410077250.5, mailed Aug. 4, 2015.

*Primary Examiner* — Joseph C Nicely
(74) *Attorney, Agent, or Firm* — Wiggin and Dana LLP; Gregory S. Rosenblatt; Jonathan D. Hall

(57) ABSTRACT

A method for the manufacture of a package encasing a Micro-Electro-Mechanical Systems (MEMS) device provides a cover having a lid and sidewalls with a port extending through the lid. A first base component is bonded to the sidewalls defining an internal cavity. This first base component further includes an aperture extending therethrough. The MEMS device is inserted through the aperture and bonded to the lid with the MEMS device at least partially overlapping the port. Assembly is completed by bonding a second base component to the first base component to seal the aperture. The package so formed has a cover with a lid, sidewalls and a port extending through the lid. A MEMS device is bonded to the lid and electrically interconnected to electrically conductive features disposed on the first base component. A second base component is bonded to the first base component spanning the aperture.

10 Claims, 15 Drawing Sheets

(51) Int. Cl.
*B81B 7/00* (2006.01)
*H01L 23/053* (2006.01)
*G01L 9/00* (2006.01)
*H04R 1/02* (2006.01)
*H04R 1/04* (2006.01)

(52) U.S. Cl.
CPC ........ *B81C 1/00309* (2013.01); *B81C 1/00333* (2013.01); *G01L 9/0042* (2013.01); *H01L 23/053* (2013.01); *H04R 1/021* (2013.01); *H04R 1/04* (2013.01); *B81B 7/0041* (2013.01); *B81B 2201/0257* (2013.01); *B81B 2203/0127* (2013.01); *B81B 2207/012* (2013.01); *B81C 2203/0109* (2013.01); *B81C 2203/052* (2013.01); *H01L 2224/16225* (2013.01); *H04R 2201/003* (2013.01)

(56) References Cited

U.S. PATENT DOCUMENTS

| | | | |
|---|---|---|---|
| 7,439,616 | B2 | 10/2008 | Minervini |
| 7,825,509 | B1 | 11/2010 | Baumhauer, Jr. et al. |
| 8,018,049 | B2 | 9/2011 | Minervini |
| 8,030,722 | B1 | 10/2011 | Bolognia et al. |
| 8,155,366 | B2 | 4/2012 | Baumhauer, Jr. et al. |
| 8,229,139 | B2 | 7/2012 | Pahl |
| 8,999,757 | B2 * | 4/2015 | Protheroe ........... B81C 1/00269 257/E23.128 |
| 9,082,883 | B2 * | 7/2015 | Protheroe ........... B81C 1/00269 |
| 2009/0314095 | A1 * | 12/2009 | Lu ................. G01L 19/141 73/727 |
| 2011/0075875 | A1 | 3/2011 | Wu et al. |
| 2011/0293128 | A1 | 12/2011 | Kuratani et al. |
| 2012/0153771 | A1 * | 6/2012 | Formosa ............. B81C 1/0023 310/300 |

* cited by examiner

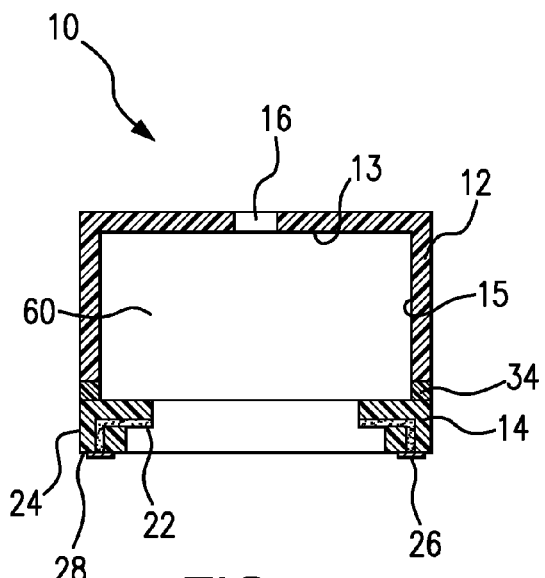
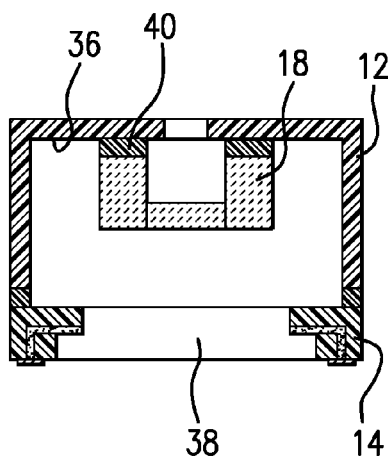
FIG. 1
FIG. 2
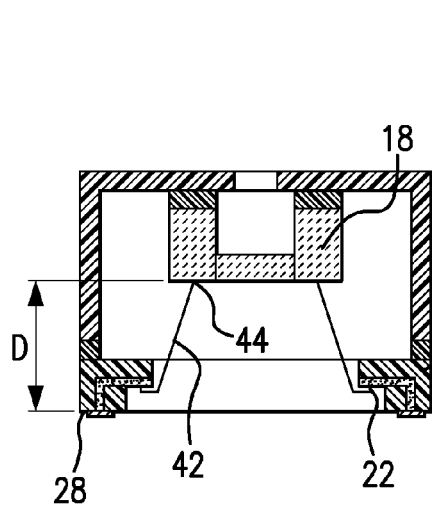
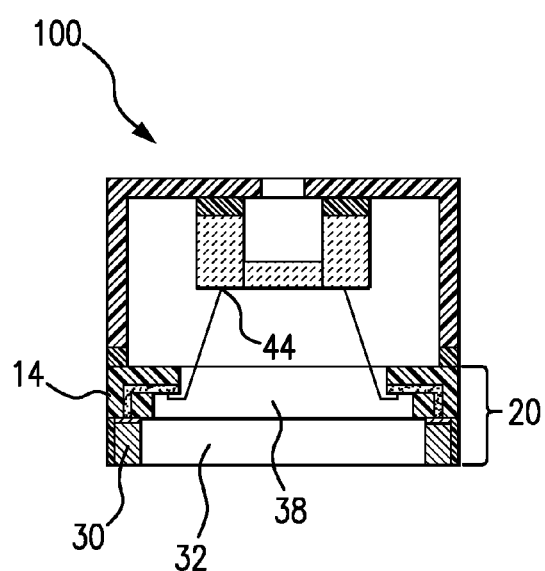
FIG. 3
FIG. 4

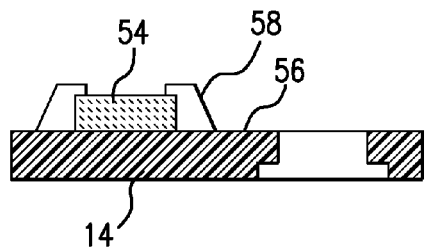 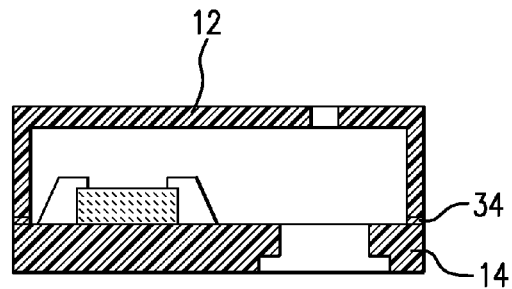
FIG. 6   FIG. 7
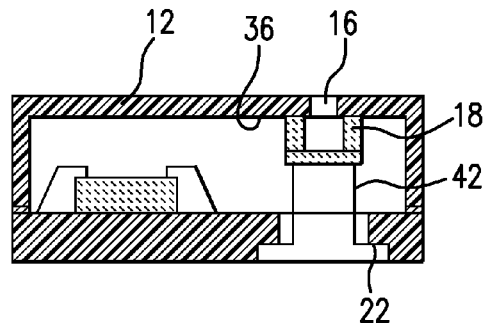 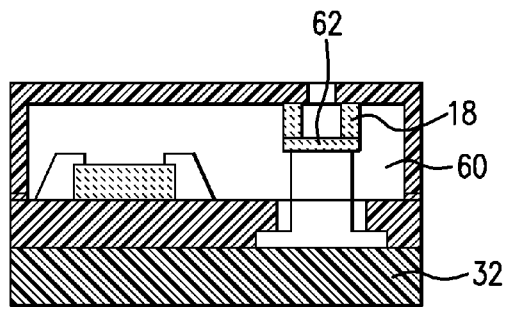
FIG. 8   FIG. 9
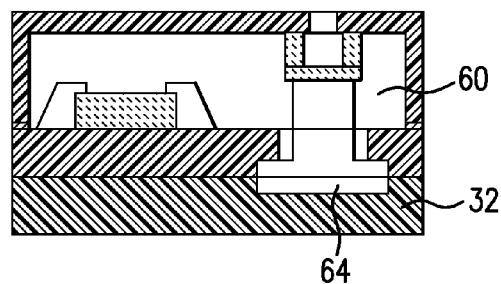
FIG. 10

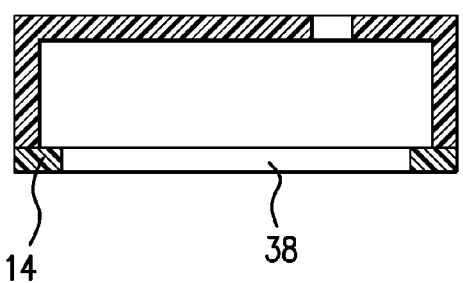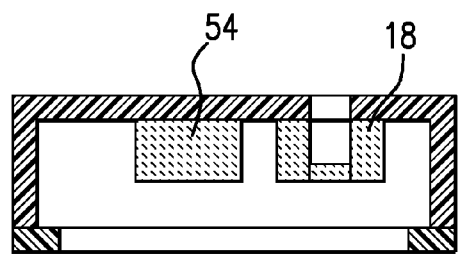
FIG. 11  FIG. 12
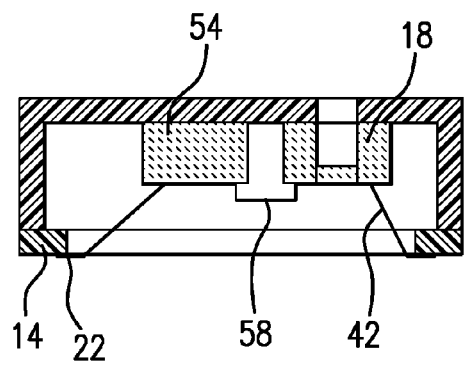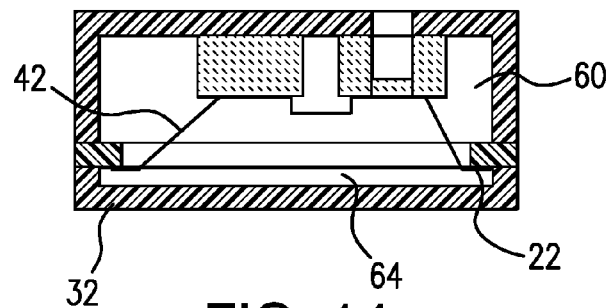
FIG. 13  FIG. 14

TOP PORT MEMS CAVITY PACKAGE AND METHOD OF MANUFACTURE THEREOF

CROSS REFERENCE TO RELATED APPLICATIONS

The present application is a divisional of U.S. patent application Ser. No. 14/142,744, entitled "Top Port MEMS Cavity Package and Method of Manufacture Thereof" and filed on Dec. 27, 2013. U.S. Ser. No. 14/142,744 is a continuation-in-part of U.S. Pat. No. 8,999,757, entitled "Top Port MEMS Cavity Package and Method of Manufacture Thereof" and filed on Mar. 4, 2013. The entire contents of U.S. Ser. No. 14/142,744 and U.S. Pat. No. 8,999,757 are incorporated herein by reference.

BACKGROUND OF THE DISCLOSURE

1. Field of the Disclosure

Disclosed is a package to house a Micro-Electro-Mechanical Systems device, and more particularly to a method for manufacture of a top port package and the so manufactured package.

2. Description of the Related Art

One Micro-Electro-Mechanical Systems (MEMS) device is an acoustic transducer used in a microphone chip for a personal electronic device (PED). These devices include, but are not limited to, cell phones, laptop computers, tablets and mobile digital devices. One acoustic transducer is disclosed in U.S. Pat. No. 5,870,482 to Loeppert et al., titled "Miniature Silicon Condenser Microphone." The acoustic transducer is disclosed as having a frame with a silicon nitride diaphragm bonded to one side of the frame and extending cantilever style over the other side. A gap between the frame and the diaphragm forms a variable air gap capacitor. Deflection of the diaphragm by acoustic (sound) waves changes the gap spacing creating a measurable change in capacitance. U.S. Pat. No. 5,870,482 is incorporated by reference herein in its entirety.

Demands on a package housing a MEMS device are stringent. The device must be protected from dirt, dust and mechanical damage. Electrical interconnection is required to transmit electrical signals between the device and other electrical components of the PED. Deflection of the diaphragm is against a fixed volume of air, requiring an air tight cavity adjacent one side of the device. Further, as cell phones and other electrical devices become smaller and more light weight, the package housing the MEMS device must contribute to those objectives. Likewise, cost constraints on the product require the package to be inexpensive and preferably not overly complex to assemble.

Representative packages for housing MEMS devices are disclosed in U.S. Pat. No. 8,030,722 to Bolognia et al., titled "Reversible Top/Bottom MEMS Package" and in published U.S. Patent Application Publication No. 2011/0075875 by Wu et al. that is titled "MEMS Microphone Package." Both U.S. Pat. No. 8,030,722 and U.S. 2011/0075875 are incorporated by reference herein in their entireties.

U.S. Pat. No. 8,030,722 discloses a package for a MEMS device having a base and a cover formed from a printed circuit board material. Conductive sidewalls electrically interconnect the base and the cover. A MEMS device is mounted to either the base or the cover and wire bonds extending from the MEMS device contact circuit traces on both the cover and the base; electrically interconnecting the MEMS device to both.

U.S. 2011/0075875 discloses a MEMS package having a MEMS device mounted to the package cover. The MEMS device is electrically interconnected to circuit traces that extend from the cover to conductive sidewalls to circuit traces formed in the base. An integrated circuit device, such as an amplifier or noise filter is electrically interconnected to the circuit traces formed in the base.

Top and bottom port packages exist mainly due to the mechanical requirements of the end application. Top port packages are often preferred as bottom port packages require a corresponding hole in the application PCB to which the microphone is mounted. However, if the ratio of air behind the membrane is larger than that in front of it the package has improved technical performance particularly regarding signal to noise ratio (larger back volume of air than front volume of air). With a bottom port package where the MEMS die is connected directly to the package substrate it is easy to get this improved ratio of back to front volume by mounting the MEMS die over the sound port. For a top port package which many applications mechanically require, it is not possible with standard packaging to mount the MEMS die in such a way to get the improved technical performance.

There are times when it is desirable to mount the MEMS device to the cover of the package encasing the device. However, forming circuit traces in the cover and electrically conductive sidewalls to transfer electric signals to and from the MEMS device, as in the disclosures referenced above, results in a complex package requiring accurate alignment which runs contrary to the objectives to simplify and reduce the cost of such a package. There remains a need for a robust package that enables mounting a MEMS device to a cover component of the package that does not have the disadvantages of complex assembly and high cost.

BRIEF SUMMARY

Disclosed herein is a method to manufacture a package encasing a Micro-Electro-Mechanical Systems (MEMS) device. The method includes the steps of: (1) Providing a cover having a lid and sidewalls with a port extending through the lid. (2) Bonding a first base component to the sidewalls thereby defining an internal cavity having surfaces formed by the lid, the sidewalls and the first base component. This first base component further has an aperture extending therethrough. (3) Inserting the MEMS device through the aperture and bonding the MEMS device to the lid with the MEMS device at least partially overlapping the port. (4) And bonding a second base component to the first base component to seal the aperture.

Also disclosed herein is method to manufacture a panel of packages to encase MEMS devices. This method includes the steps of: (1) Providing a panel having a matrix of first base components. Each first base component has an aperture extending there through. (2) Providing a cover for each first base component member of the matrix. Each cover has a lid and sidewalls with a port extending through the lid. (3) Bonding a first base component to the sidewalls thereby defining an internal cavity having surfaces formed by the lid, the sidewalls and the first base component. (4) Inserting a MEMS device through each aperture and bonding that MEMS device to the lid with the MEMS device at least partially overlapping the port. (5) Bonding a second base component to each first base component to seal the aperture. (6) And singulating the first panel to form a plurality of packages.

Also disclosed are the packages so produced, which include a cover having a lid and sidewalls with a port extending through the lid. An aperture-containing first base component bonded to the sidewalls. A MEMS device bonded to the lid and electrically interconnected to electrically conductive features disposed on a surface of the first base component. A second base component is bonded to the first base component spanning the aperture.

The details of one or more embodiments of the invention are set forth in the accompanying drawings and the description below. Other features, objects and advantages of the invention will be apparent from the description and drawings, and from the claims.

IN THE DRAWINGS

FIG. 1 is a first intermediate assembly in the manufacture of a top port MEMS cavity package in accordance with a first embodiment.

FIG. 2 is a second intermediate assembly in the manufacture of the top port MEMS cavity package in accordance with a first embodiment.

FIG. 3 is a third intermediate assembly in the manufacture of the top port MEMS cavity package in accordance with the first embodiment.

FIG. 4 is the top port MEMS cavity package manufactured in accordance with the first embodiment.

FIG. 6 is a first intermediate assembly in the manufacture of a top port MEMS cavity package in accordance with a second embodiment.

FIG. 7 is a second intermediate assembly in the manufacture of the top port MEMS cavity package in accordance with the second embodiment.

FIG. 8 is a third intermediate assembly in the manufacture of the top port MEMS cavity package in accordance with the second embodiment.

FIG. 9 is the top port MEMS cavity package manufactured in accordance with the second embodiment.

FIG. 10 illustrates an alternative substrate for the packages disclosed herein.

FIG. 11 is a first intermediate assembly in the manufacture of a top port MEMS cavity package in accordance with a third embodiment.

FIG. 12 is a second intermediate assembly in the manufacture of the top port MEMS cavity package in accordance with the third embodiment.

FIG. 13 is a third intermediate assembly in the manufacture of the top port MEMS cavity package in accordance with the third embodiment.

FIG. 14 is the top port MEMS cavity package manufactured in accordance with the third embodiment.

Figure 20A:
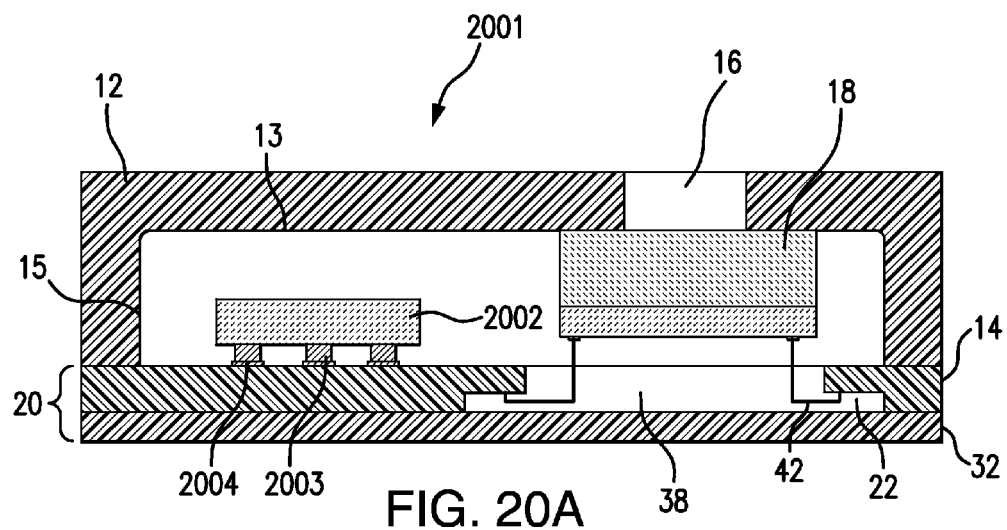
Figure 20B:
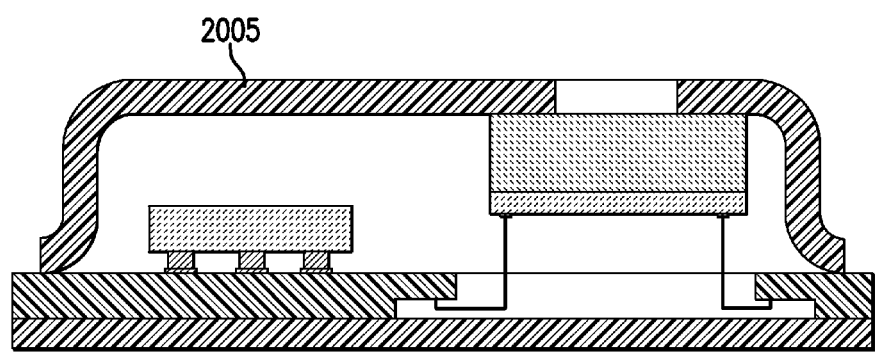

FIGS. 20(A)-(B) are schematic side views of an embodiment package having a circuit device attached therein in a flip chip manner.

Figure 21A:
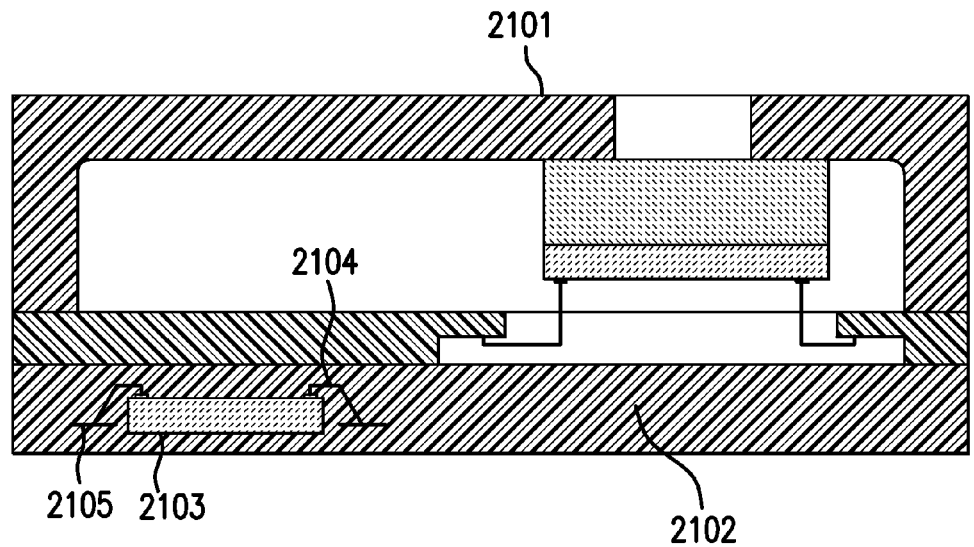
Figure 21B:
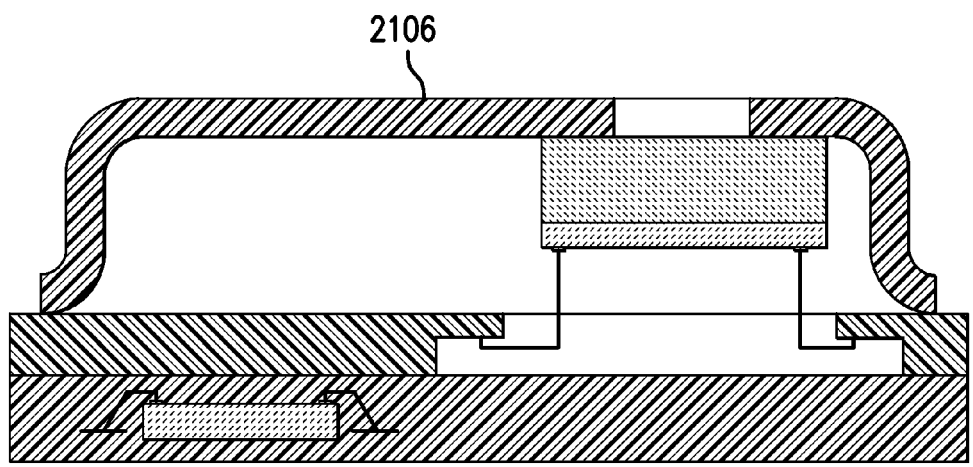

FIGS. 21(A)-(B) are schematic side views of an embodiment package having an embedded circuit device.

Figure 22A:
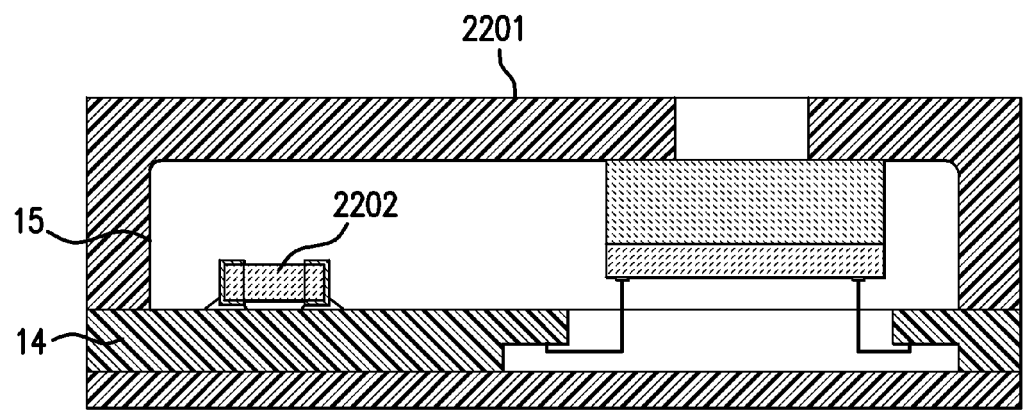
Figure 22B:
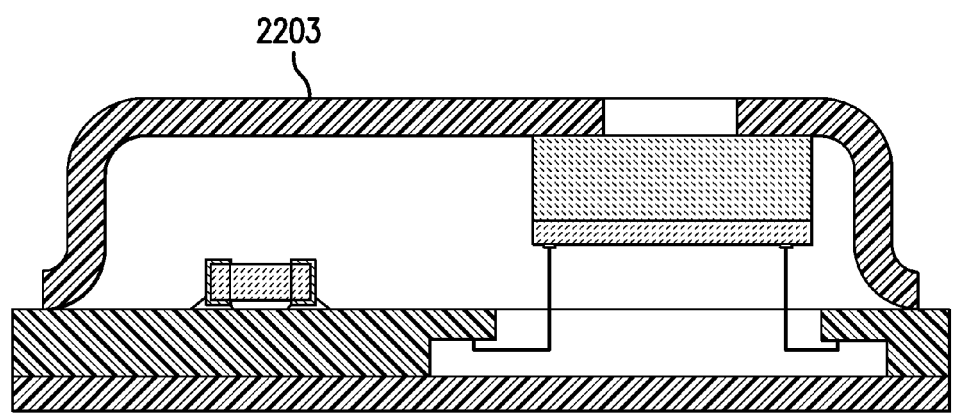

FIGS. 22(A)-(B) are schematic side views of an embodiment package having a passive component attached therein.

Figure 23A:
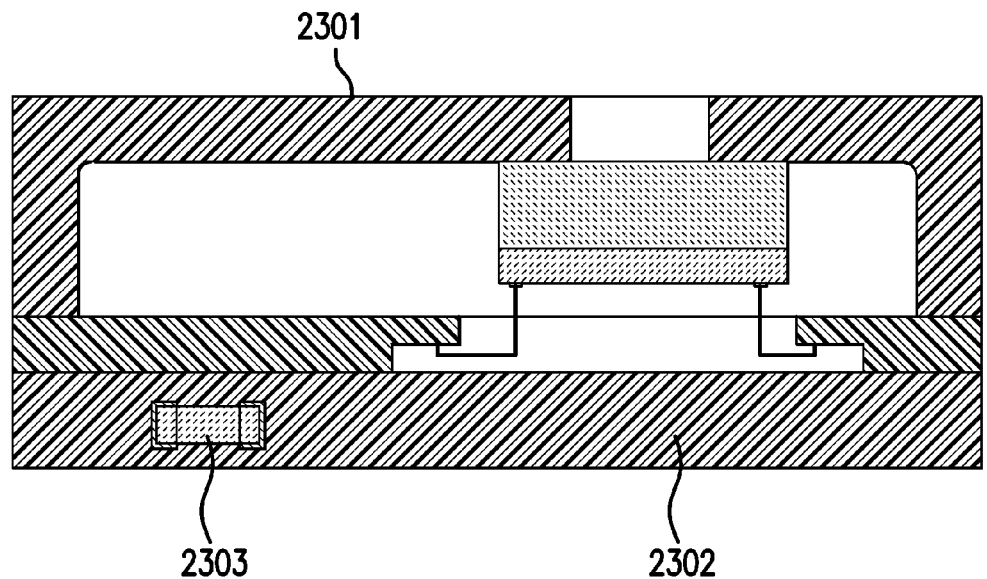
Figure 23B:
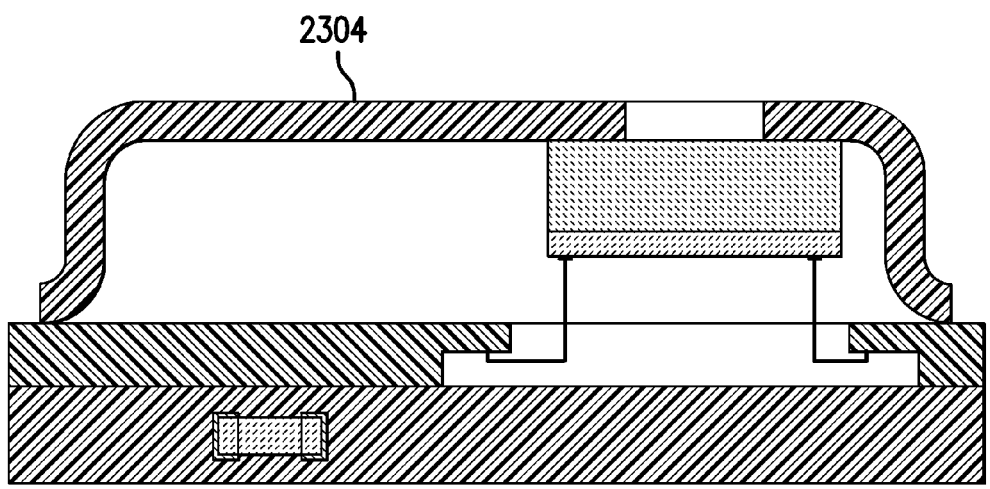

FIGS. 23(A)-(B) are schematic side views of an embodiment package having an embedded passive component.

Figure 24A:
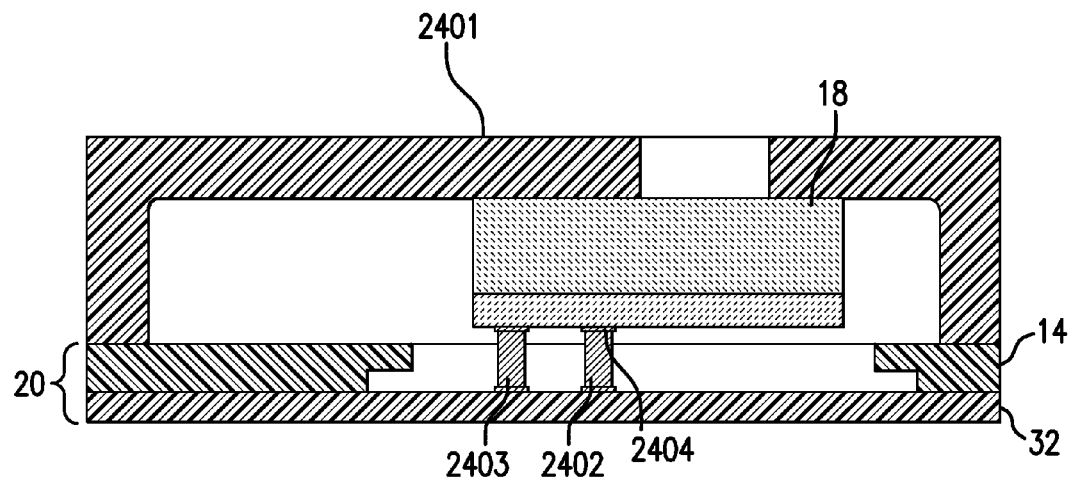
Figure 24B:
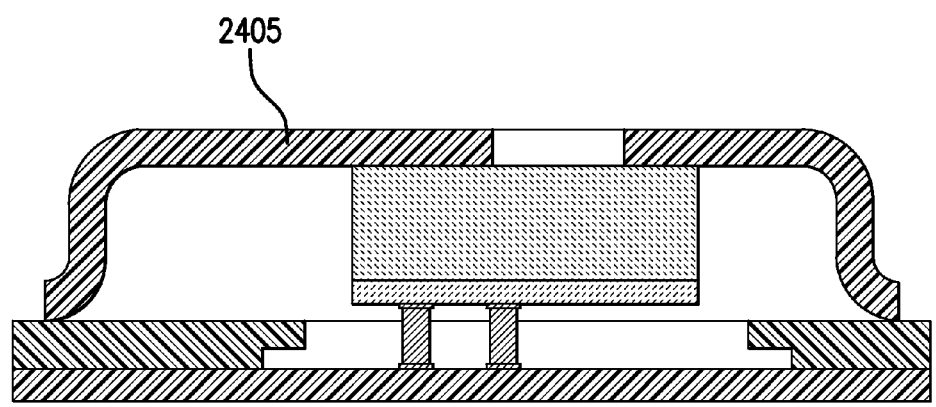

FIGS. 24(A)-(B) are schematic side views of an embodiment package in which a MEMS device is attached in a flip chip manner.

Figure 25A:
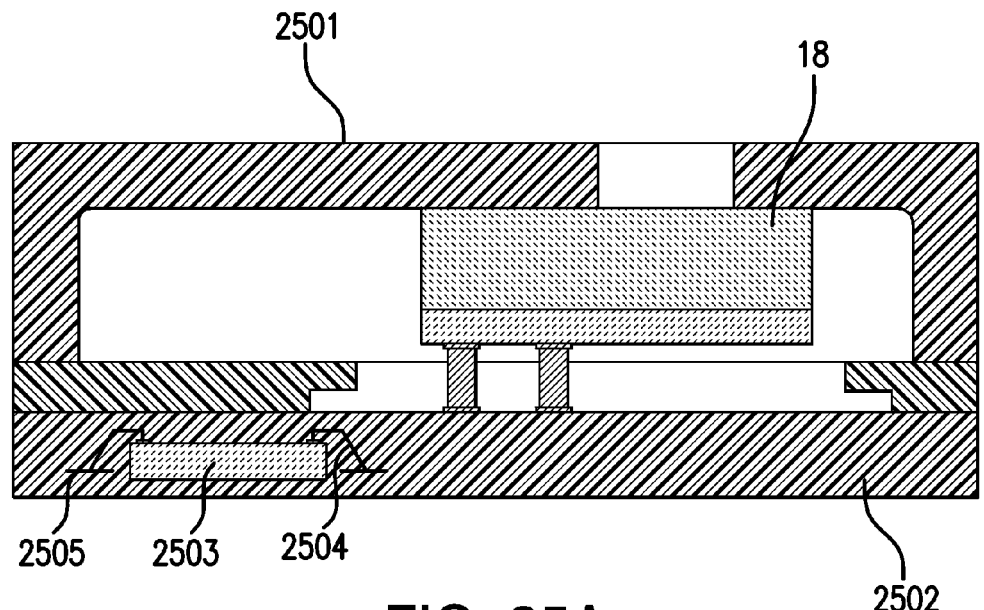
Figure 25B:
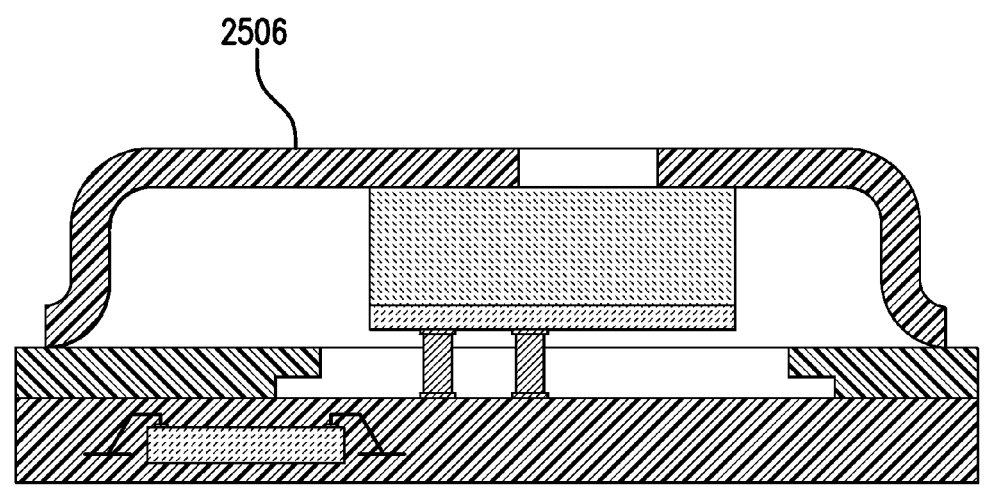

FIGS. 25(A)-(B) are schematic side views of an embodiment package in which a MEMS device is attached in a flip chip manner and there is an embedded circuit device.

Figure 26A:
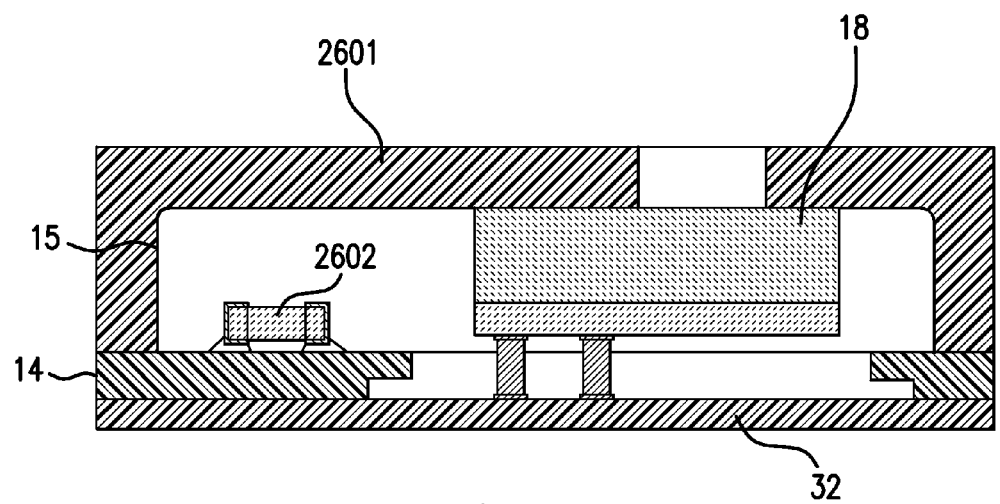
Figure 26B:
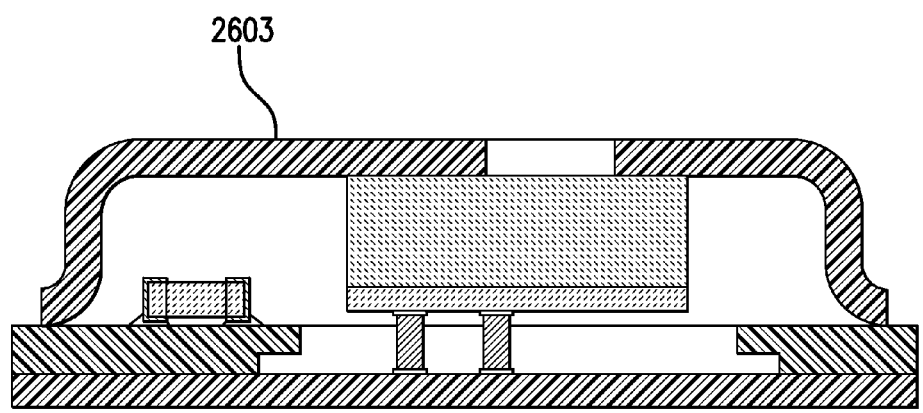

FIGS. 26(A)-(B) are schematic side views of an embodiment package in which a MEMS device is attached in a flip chip manner and there is an attached passive component.

Figure 27A:
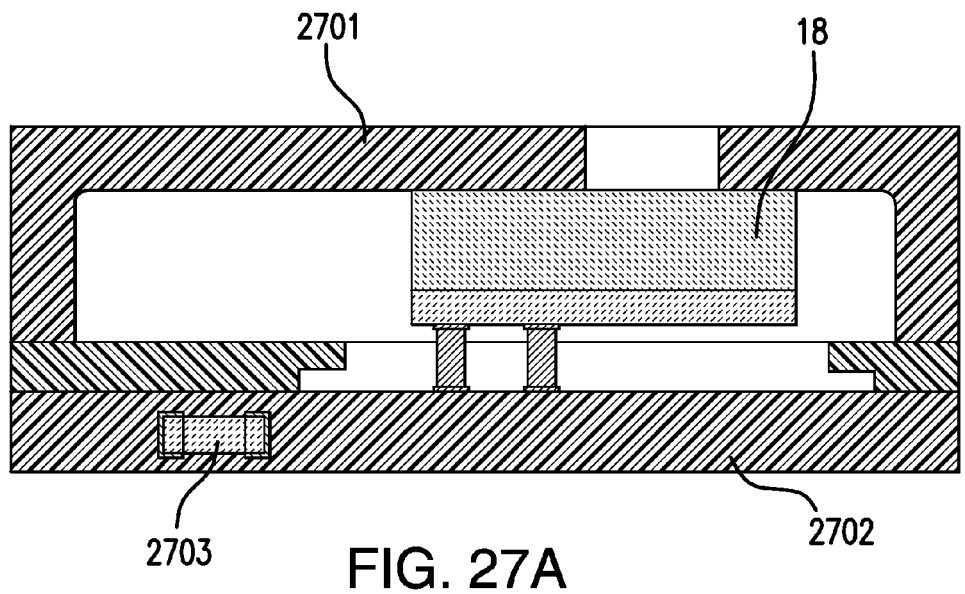
Figure 27B:
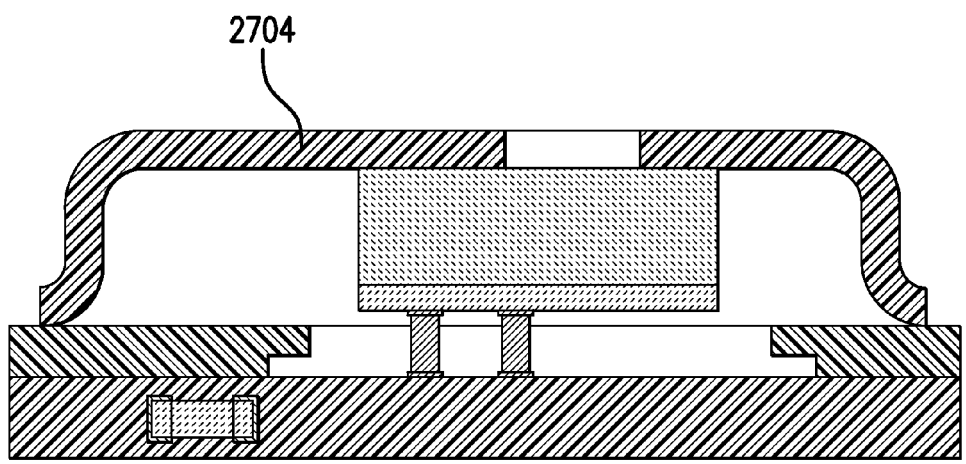

FIGS. 27(A)-(B) are schematic side views of an embodiment package in which a MEMS device is attached in a flip chip manner and there is an embedded passive component.

DETAILED DESCRIPTION

FIGS. 1 through 4 illustrate in cross-sectional representation a first assembly process for the manufacture of a top port MEMS cavity package (reference numeral 100 in FIG. 4). In FIG. 1, a first intermediate assembly 10 includes a cover 12 and a first base component 14. While "cover" and "top" are used interchangeably, it is recognized that the package may be flipped over and the cover be the bottom. As such, the word cover should be broadly construed to be the non-substrate side of the package.

The cover 12 has a lid 13 and sidewalls 15. A port 16 extends through the lid 13 and is sized to permit acoustic waves to interact with a MEMS device (reference numeral 18 in FIG. 2). The port 16 may be an open cavity or sealed with a fibrous material or polymer film to protect the MEMS device. The cover 12 is formed from any suitable material such as a metal, ceramic, liquid crystal polymer or other molded polymer. The first base component 14 forms a portion of the substrate (reference numeral 20 in FIG. 4). The first base component 14 is formed from an electrical dielectric as is typically used in the manufacture of printed circuit boards, for example, FR-4 or a ceramic. Wire bond attach sites 22 and conductive circuit traces 24 are formed on and in the first base component. A metallized bond pad 26 may be formed on an exterior surface 28 of the first base component 14 to facilitate electrical interconnection to an electrically conductive via 30 formed in a second base component 32 (FIG. 4).

Sidewalls 15 of the cover 12 are bonded to first base component 14 with an adhesive 34 or other sealant thereby defining an internal cavity 60 having surfaces formed by the lid 13, sidewalls 15 and first base component 14. As electrical interconnection between circuit traces in the cover 12 and circuit traces in the first base components 14 is not necessary, adhesive 34 need not be electrically conductive, and is preferably a dielectric material such as an epoxy, that may be applied by any suitable process, such as printed, dispensed or dipped. Further, precise alignment of the cover 12 and first base component 14 to align circuit traces is not required.

With reference to FIG. 2, a MEMS device 18, such as described in U.S. Pat. No. 5,870,482, is attached to an interior surface 36 of the cover 12 by insertion through an aperture 38 that extends through the first base component 14. The aperture 38 is sufficiently large to enable the MEMS devise 18 to be inserted there through with sufficient precision to align the MEMS device over the port 16 to at least partially overlap the port. Accurate insertion may be obtained using standard production die attach equipment using fiducials and alignment features, such as on the substrate 20 shown in FIG. 4 for alignment. The MEMS device is then bonded, such as with adhesive 40, to the cover 12. Electrical interconnection between the MEMS device 18 and circuitry, if any, on the cover 12 is not required and the MEMS device is preferably electrically isolated from the cover 12.

Referring to FIG. 3, bond wires 42 are attached to wire bond sites 44 on the MEMS device 18. A distance, D, between the exterior surface 28 of the first base component 14 and the wire bond sites 44 is on the order of from 0 to 500 μm, within the capability of a standard wire bond machines. Opposing ends of the bond wires 42 are bonded to the wire bond attach sites 22.

As shown in FIG. 4, the top port MEMS cavity package 100 is completed by bonding the second base component 32 to the first base component 14 sealing aperture 38 to make an air tight seal for internal cavity 60 and to form electrical interconnections.

Figure 19:
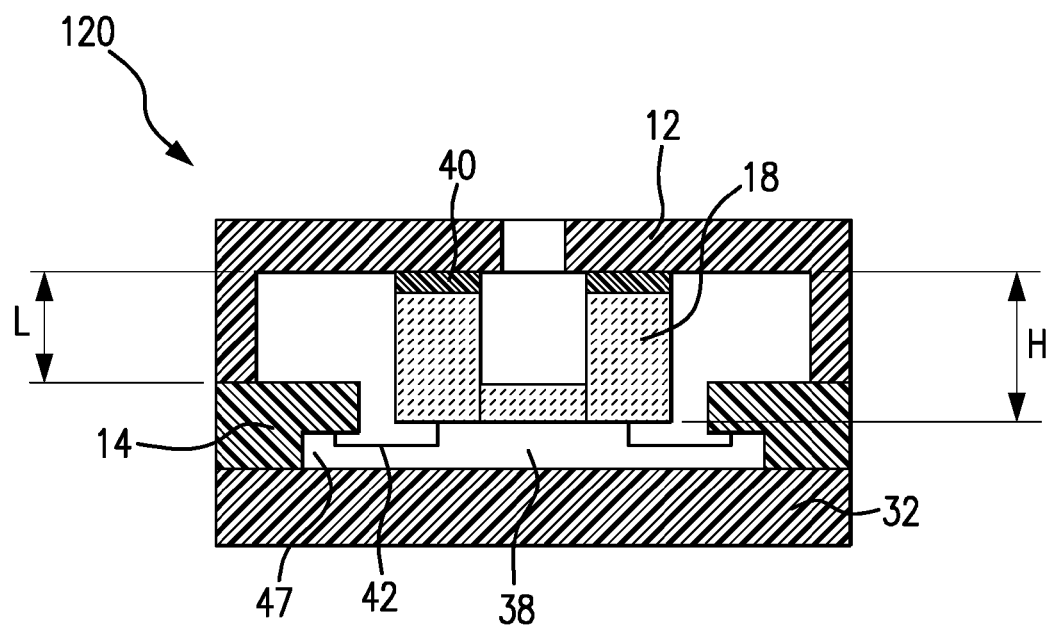
FIG. 19 is an alternative top port MEMS cavity package manufactured in accordance with the first embodiment.

FIG. 19 illustrates an alternative top port MEMS cavity package 120 manufactured in accordance with the first embodiment. In this alternative, the combined height, H, of the MEMS device 18 and adhesive 40 is greater than the length, L, of the sidewalls 45 of the cover 12. A portion of the MEMS device 18 is accommodated in the aperture 38 of the first base component 14. Bond wires 42 fit within a clearance 47 between the first base component 14 and the second base component 32.

Figure 5:
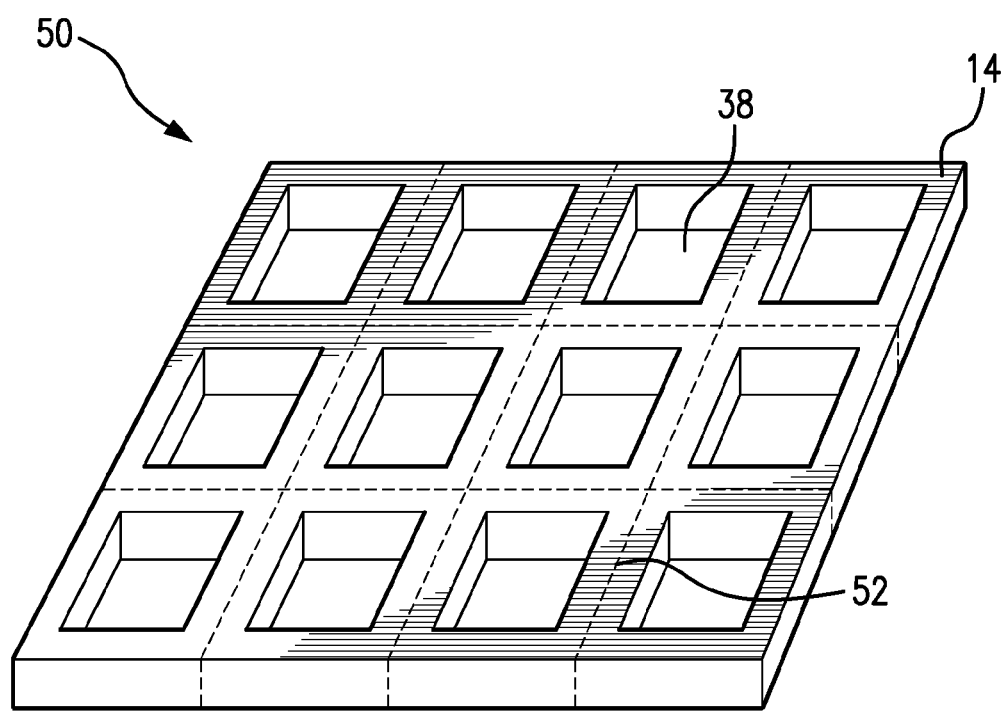
FIG. 5 is a perspective view of a panel of first base components for used in the manufacture of a plurality of top port MEMS cavity packages.

While the top port MEMS cavity package 100 may be assembled in singular form as illustrated in FIGS. 1-4, package assembly is particularly amendable to automated assembly of an array of package units. FIG. 5 is a perspective view of a panel 50 having a matrix of first base components 14, each matrix member having apertures 38 for use in the manufacture of a plurality of top port MEMS cavity packages. The assembly steps shown in FIGS. 1-4, or other embodiments described below, are performed using either individual covers or a second panel having a matrix of covers for bonding to the matrix of first base components. After insertion and wirebonding of the MEMS devices and other device components, the package units are singulated by cutting along saw lines 52. The second base component may be added to create an air tight seal and electrical interconnection in either panel form, as a third panel before singulation, or as individual components subsequent to singulation. While the panel 50 is illustrated for twelve packages, much larger matrices, for example, containing up to 1000 package units may be utilized. A typical panel contains from 75 to 100 units.

FIGS. 6-9 illustrate an assembly process in accordance with a second embodiment. As shown in FIG. 6, an integrated circuit device 54, such as an amplifier or a noise filter, is attached to a surface 56 of the first base component 14 and electrically interconnected to electrically conductive features, such as conductive traces on a surface 56, of first base component 14, such as by wire bonds 58 and also electrically interconnected to the MEMS device.

Referring to FIG. 7, cover 12 is then bonded to the first base component 14, such as with adhesive 34. Next, as shown in FIG. 8, the MEMS device 18 is bonded to interior surface 36 of the cover 12, forming an air tight seal around the port 16. Bond wires 42 electrically interconnect the MEMS device 18 to wire bond attach sites 22. The package is then completed by bonding of second base component 32, as illustrated in FIG. 9.

Each MEMS package disclosed herein has an internal cavity 60 that undergoes changes in volume and pressure when a membrane 62 of the MEMS device 18 is displaced by acoustic waves. The volume of this internal cavity 60 may be changed, changing the sensitivity of the package, such as by addition of a blind cavity 64 formed in the second base component 32, as shown in FIG. 10. This blind cavity 64 is aligned with the internal cavity 60 to be in fluid communication therewith. Attachment of the MEMS device 18 requires a seal completely around the base of the MEMS device so that there is no leakage or alternate routes for sound waves to travel.

FIGS. 11-14 illustrate an assembly process in accordance with a second embodiment. As shown in FIG. 11, the aperture 38 in the first base component 14 is enlarged to facilitate insertion of both an integrated circuit device 54 and the MEMS device 18 (FIG. 12). With reference to FIG. 13, wire bond 58 then electrically interconnects the integrated circuit device 54 and the MEMS device 18. Wire bonds 42 electrically interconnect these devices 54, 18 to wire bond attach sites 22 on the first base component 14. Second base component 32 then seals the package forming internal cavity 60. In any of the embodiments herein, secondary cavity 64 may extend over the metallized bond pads 26 to accommodate bond wires 42.

Figure 15:
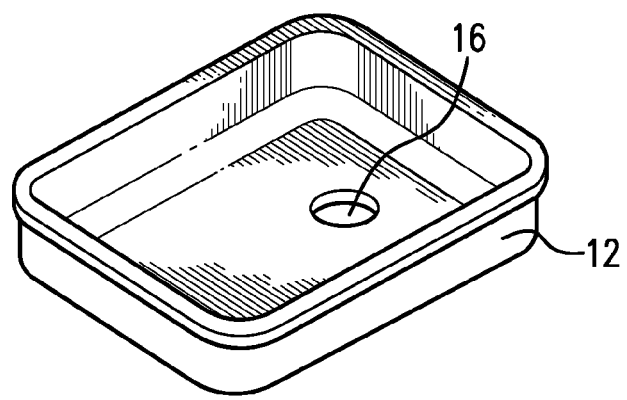
FIG. 15 is a bottom perspective view of a cover for the packages disclosed herein.
Figure 16:
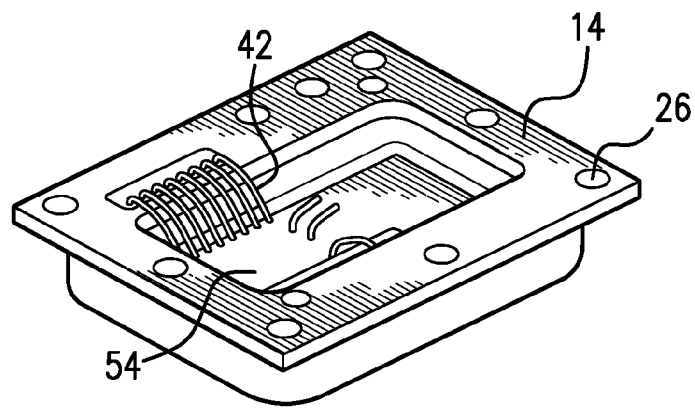
FIG. 16 is a bottom perspective view of an intermediate assembly for the packages disclosed herein.
Figure 17:
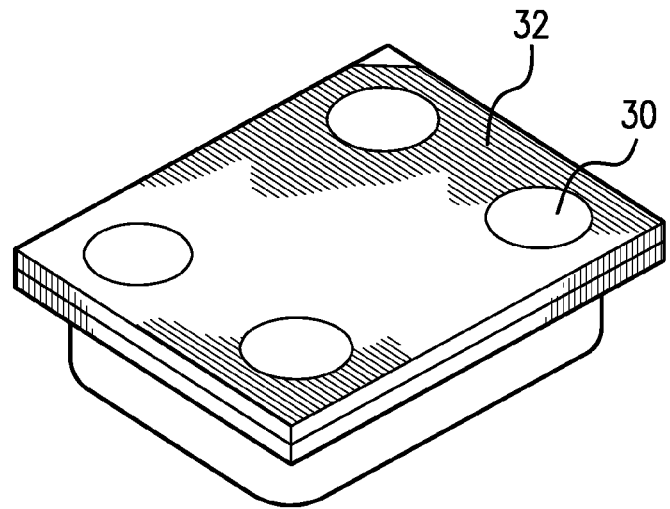
FIG. 17 is a bottom perspective view of an assembled package.
Figure 18:
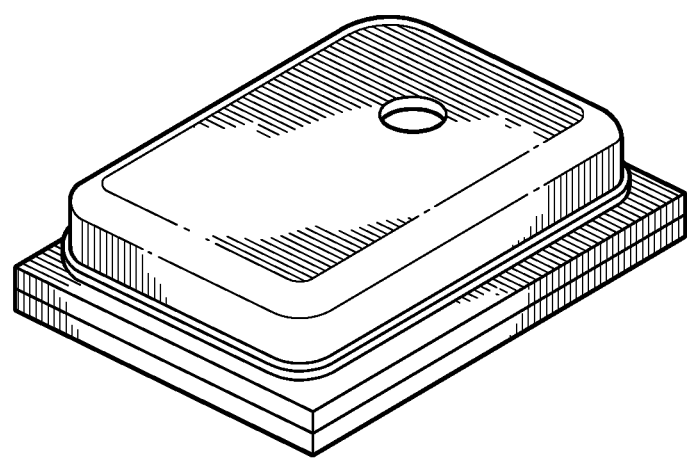
FIG. 18 is a top perspective view of an assembled package.

FIG. 15 is a perspective view of the inside of a cover 12 illustrating the port 16. FIG. 16 is a perspective view of an intermediate assembly showing wire bonds 42 extending from an integrated circuit device 54 to conductive circuit traces (not visible) on the first base component 14. The conductive circuit traces terminate at metallized bond pads 26. FIG. 17 illustrates the completed package with electrically conductive vias 30 extending to an exterior surface of the second base component 32 for providing electrical interconnection between the enclosed devices and external circuitry and devices. FIG. 18 is a top perspective view of the assembled package.

FIGS. 20(A)-(B) illustrate an embodiment package 2001, that in many respects is similar to certain other embodiments described above. Circuit device 2002 is connected to first base component 14 in a flip chip manner. Connectors 2003 electrically link circuit device 2002 to connection points 2004. Connectors 2003 may be any suitable material, such as solder or gold. Connection points 2004 may be metalized pads. It should be understood that flip chip connection methods are known to those of skill in the art to which the present application pertains. Circuit device 2002 becomes disposed within the internal cavity of package 2001 when first base component 14 and sidewalls 15 are bonded. In the production of packages as disclosed in the present application, circuit device 2002 may be attached to first base component 14 in a flip chip manner before the bonding of sidewalls 15 and first base component 14. FIG. 20 B illustrates the use of alternate cover 2005.

FIGS. 21(A)-(B) illustrate embodiment package 2101. Second base component 2102 has embedded in it circuit device 2103. Bond wires 2104 electrically connect circuit device 2103 to bond wire attachment sites 2105. FIG. 21B illustrates the use of alternate cover 2106. In the production of packages as disclosed in the present application, circuit device 2103 may be embedded prior to assembly of the package 2101.

FIGS. 22(A)-(B) illustrate embodiment package 2201. Passive component 2202 is attached to first base component 14. Passive component 2202 is attached in such a manner that it is disposed within the internal cavity of the package when first base component 14 and side walls 15 are bonded. In the production of packages as disclosed in the present application, circuit device 2202 may be attached to first base component 14 before the bonding of sidewalls 15 and first base component 14. FIG. 22B illustrates the use of alternate cover 2203.

FIGS. 23(A)-(B) illustrate embodiment package 2301. Second base component 2302 has embedded in it passive component 2303. FIG. 23B illustrates the use of alternate cover 2304. In the production of packages as disclosed in the present application, passive component 2303 may be embedded prior to assembly of the package.

FIGS. 24(A)-(B) illustrate embodiment package 2401. MEMS device 18 is attached to second base component 32 in a flip chip manner. Connectors 2402 electronically connect first and second connection points 2403 and 2404, respectively, thus electrically connecting MEMS device 18 to first connection points 2403. Package 2401 may be produced, in part, by electrically connecting MEMS device 18 to second base component 32 in a flip chip manner during the step of bonding second base component 32 to first base component 14. FIG. 24B illustrates the use of alternate cover 2405.

FIGS. 25(A)-(B) illustrate embodiment package 2501. MEMS device 18 is attached to second base component 2502 in a flip chip manner. Circuit device 2503 is embedded in second base component 2502. Bond wires 2504 electrically connect circuit device 2503 to bond wire connection sites 2505. In the production of packages as disclosed in the present application, circuit device 2503 may be embedded prior to assembly of the package. FIG. 25B illustrates the use of alternate cover 2506.

FIGS. 26(A)-(B) illustrate embodiment package 2601. MEMS device 18 is attached to second base component 32 in a flip chip manner. Passive component 2602 is attached to first base component 14. Passive component 2602 is attached in such a manner that it is disposed within the internal cavity of the package when first base component 14 and side walls 15 are bonded. In the production of packages as disclosed in the present application, passive component 2602 may be attached to first base component 14 before the bonding of sidewalls 15 and first base component 14. FIG. 26B illustrates the use of alternate cover 2603.

FIGS. 27(A)-(B) illustrate embodiment package 2701. MEMS device 18 is attached to second base component 2702 in a flip chip manner. Second base component 2702 has embedded in it passive component 2703. FIG. 27B illustrates the use of alternate cover 2704. In the production of packages as disclosed in the present application, passive component 2703 may be embedded prior to assembly of the package.

One or more embodiments of the present invention have been described. Nevertheless, it will be understood that various modifications may be made without departing from the spirit and scope of the invention. Accordingly, other embodiments are within the scope of the following claims.

We claim:

1. A package for housing a Micro-Electro-Mechanical Systems (MEMS) device, comprising:
   a cover having a lid and sidewalls with a port extending through the lid;
   a first base component having an aperture extending therethrough and bonded to said sidewalls;
   a MEMS device bonded to said lid and electrically interconnected to electrically conductive features disposed on a surface of said first base component; and
   a second base component bonded to said first base component spanning said aperture.

2. The package of claim 1 wherein a circuit device is disposed within said package and attached to said first base component in a flip chip manner.

3. The package of claim 1 wherein a circuit device is embedded within said second base component.

4. The package of claim 1 wherein a passive component is disposed within said package and attached to said first base component.

5. The package of claim 1 wherein a passive component is embedded within said second base component.

6. A package for housing a MEMS device, comprising:
   a cover having a lid and sidewalls with a port extending through the lid;
   a first base component having an aperture extending therethrough and bonded to said sidewalls;
   a second base component bonded to said first base component spanning said aperture;
   a MEMS device bonded to said lid and electrically interconnected to said second base component in a flip chip manner.

7. The package of claim 6 wherein a circuit device is embedded within said second base component.

8. The package of claim 6 wherein a passive component is disposed within said package and attached to said first base component.

9. The package of claim 6 wherein a passive component is embedded within said second base component.

10. A package for housing a MEMS device, comprising:
    a cover having a lid and sidewalls with a port extending through the lid;
    a base component containing an aperture and bonded to said sidewalls;
    a circuit device disposed within said package and attached to said base component in a flip chip manner;
    a MEMS device bonded to said lid and electrically interconnected to the circuit device.

* * * * *